(12) United States Patent
Lopatinsky et al.

(10) Patent No.: US 7,167,364 B2
(45) Date of Patent: Jan. 23, 2007

(54) COOLER WITH BLOWER BETWEEN TWO HEATSINKS

(75) Inventors: Edward Lopatinsky, San Diego, CA (US); Lev Fedoseyev, El Cajon, CA (US); Saveliy Rosenfeld, San Diego, CA (US); Daniel Schaefer, Palm Desert, CA (US)

(73) Assignee: Rotys Inc., San Diego, CA (US)

( * ) Notice: Subject to any disclaimer, the term of this patent is extended or adjusted under 35 U.S.C. 154(b) by 272 days.

(21) Appl. No.: 10/809,977

(22) Filed: Mar. 26, 2004

(65) Prior Publication Data

US 2004/0190261 A1 Sep. 30, 2004

Related U.S. Application Data

(60) Provisional application No. 60/458,200, filed on Mar. 27, 2003.

(51) Int. Cl.
*H05K 7/20* (2006.01)
*H02K 1/22* (2006.01)
*H01L 23/34* (2006.01)
*F28F 7/00* (2006.01)
*F04B 35/04* (2006.01)
*F01D 5/08* (2006.01)

(52) U.S. Cl. .................. 361/697; 310/268; 310/62; 310/63; 310/156.35; 310/52; 310/208; 361/696; 361/704; 361/700; 257/713; 257/714; 165/80.3; 165/80.4; 165/122; 174/16.3; 417/410.1; 415/176

(58) Field of Classification Search ............... 361/697, 361/700; 310/268
See application file for complete search history.

(56) References Cited

U.S. PATENT DOCUMENTS

| 2,068,820 | A | * | 1/1937 | Lagache et al. ............... 310/93 |
| 5,890,373 | A | * | 4/1999 | Smith ......................... 62/428 |
| 5,959,837 | A | * | 9/1999 | Yu .............................. 361/697 |
| 6,005,320 | A | * | 12/1999 | Kim et al. ............. 310/156.36 |
| 6,394,175 | B1 | * | 5/2002 | Chen et al. ................. 165/80.3 |
| 6,422,307 | B1 | * | 7/2002 | Bhatti et al. ................. 165/185 |
| 6,625,021 | B1 | * | 9/2003 | Lofland et al. ............. 361/697 |
| 6,657,734 | B1 | * | 12/2003 | Monz et al. ................. 356/601 |
| 6,745,824 | B2 | * | 6/2004 | Lee et al. ............... 165/104.14 |
| 6,779,595 | B1 | * | 8/2004 | Chiang .................. 165/104.33 |
| 6,874,566 | B1 | * | 4/2005 | Artman et al. ............. 165/80.3 |
| 6,909,608 | B2 | * | 6/2005 | Fan ............................ 361/700 |

(Continued)

FOREIGN PATENT DOCUMENTS

WO    WO 03/023289 A2 *    3/2003

*Primary Examiner*—Lisa Lea-Edmonds
*Assistant Examiner*—Zachary Pape

(57) ABSTRACT

A cooler for cooling of electronic components comprises at least two heatsinks thermally connected with each other by heat spreading means, and a double inlet centrifugal blower comprises a casing with two inlets and an outlet, a radial impeller with an axle and an electric drive. The cooler thermally connected with the electronic component. Each of the heatsinks comprises inflow and outflow openings, and thermally connected heat exchanging means and a base. The impeller comprises radial blades located from both sides of an impeller disk. The double inlet centrifugal blower is located between the heatsinks thus each of the outflow openings is coincided with the closest inlet, so cooling air flows through the inflow openings, the heat exchanging means, the outflow openings and the inlets of the blower in a series way.

6 Claims, 7 Drawing Sheets

U.S. PATENT DOCUMENTS

| | | |
|---|---|---|
| 6,920,045 B2 * | 7/2005 | Huang et al. ................ 361/700 |
| 6,940,717 B2 * | 9/2005 | Shih-Tsung ................. 361/695 |
| 7,071,587 B2 * | 7/2006 | Lopatinsky et al. .......... 310/64 |
| 7,112,910 B2 * | 9/2006 | Lopatinsky et al. ........ 310/268 |
| 2004/0245866 A1 * | 12/2004 | Lopatinsky et al. .......... 310/64 |
| 2005/0121996 A1 * | 6/2005 | Lopatinsky et al. ........ 310/268 |
| 2006/0021735 A1 * | 2/2006 | Lopatinsky et al. ....... 165/80.3 |

* cited by examiner

COOLER WITH BLOWER BETWEEN TWO HEATSINKS

CROSS-REFERENCE TO RELATED APPLICATIONS

The present application claims the benefit of priority of U.S. Provisional Patent Application Ser. No. 60/458,200 filed on Mar. 27, 2003 for Edward Lopatinsky et al. the entire content of which is incorporated herein by reference.

BACKGROUND OF THE INVENTION

The present invention relates generally to cooling systems. More particularly, the present invention relates to cooling systems for regulating the temperature of electronic components. The present invention is particularly, but not exclusively, useful for a cooling system for regulating the temperature of electronic components of a desktop computer.

During normal operation, most electronic devices generate significant amounts of heat. If this heat is not continuously removed, the electronic device may overheat, resulting in damage to the device and/or a reduction in operating performance.

In order to avoid such problems caused by overheating, cooling devices are often used in conjunction with electronic devices.

One such cooling device used in conjunction with electronic devices is a heatsink. In such device, a heatsink is formed from a material, which readily conducts heat. The heatsink is usually placed on top of, and in physical contact with, the electronic device.

One method of increasing the cooling capacity of these heatsinks is by including a plurality of cooling fins that are physically connected to the heatsink. These fins serve to increase the surface area of the heatsink and, thus, maximize the transfer of heat from the heatsink to the ambient air. In this manner, the heatsink draws heat away from the electronic device and transfers the heat to the ambient air.

In order to further enhance the cooling capacity of a heatsink device, an electrically powered blower (an axial fan may serve as the blower) is often mounted within or on top of the heatsink. In operation, the blower forces air to pass over the fins of the heatsink, thus, cooling the fins by enhancing the heat transfer from the fins into the ambient air. As the fins are cooled, heat can be drawn from the electronic device and into the heatsink at a faster rate. The blower typically draws air into the heatsink from the top of the heatsink, passes the air over the fins, and exhausts the air from the heatsink in the vicinity of the bottom of the heatsink. Accordingly, the exhaust air is hotter than the intake air.

There are known devices of this type—see, for example, U.S. Pat. No. 6,152,214 "Cooling device and method". The design of the device comprises an axial fan that produces a flow passing by heat exchanging channels of the heatsink. However, due to the weak airflow in the area adjacent to the axial fan axle, the conditions for cooling of the central part of the heatsink located underneath a hub of the axial fan are unfavorable. In this case non-uniform cooling of the heatsink and electronic device, for example, processor, will take place. Besides, the energy of airflow outgoing from the axial fan impeller in the axial direction is expended because of deceleration and turn in motion before this airflow enters to the heat exchanging channels. This fact decreases the speed of airflow passing by the heat exchanging channels, which, in its turn, doesn't allow obtaining good conditions for the heat exchange process.

Centrifugal fans are used rarely in the cooling device designs for the purpose of producing airflow.

Specifically, U.S. Pat. No. 5,838,066 "Miniaturized cooling fan type heatsink for a semiconductor device" offers a design employing a centrifugal fan that is installed to the side of the heatsink. In one particular embodiment of this invention the cooling airflow passes by rectilinear heat exchanging channels of the heatsink.

However, placement of centrifugal blower to the side of the heatsink increases device size. In addition, the location of centrifugal blower leads to insufficient coordination between the direction of channel inlets and direction of airflow supplied from the blower. Due to mentioned circumstance hydraulic losses result a reduction of airflow inside heat exchanging channels and decline heat exchange efficiency. A portion of airflow energy is also expended on friction against the casing, in which the blower is enclosed.

It is the object of the current invention to create such cooler for electronic components that would combine a heatsink and a centrifugal blower that would be capable of significantly improving the thermal efficiency compared to any of the prior art.

SUMMARY OF THE INVENTION

Accordingly, it is an object of the present invention to provide an apparatus including at least two heatsinks and a centrifugal blower for cooling of electronic components, which is capable of significantly improving cooling performance thereof.

In order to achieve these objectives, according to the present invention, an apparatus for cooling of electronic components comprises at least two heatsinks thermally connected with each other by heat spreading means, and at least one double inlet centrifugal blower comprising a casing with two inlets and an outlet, an impeller with an axle and an electric drive, said cooler thermally connected with said electronic component.

Each of said heatsinks comprising inflow and outflow openings, and thermally connected heat exchanging means and a base. Said double inlet centrifugal blower located between said heatsinks thus each of said outflow opening coincide with said closest inlet, so cooling air flows through said inflow openings, said heat exchanging means, said outflow openings and inlets of said blower in a series way.

In a preferred embodiment the base of at least one said heatsink thermally connected with said electronic component. In this embodiment said heat spreading means is at least one heat pipe comprising evaporator and condenser parts that thermally connected with said bases of two different heatsinks.

According to the second object of the present invention, said heat spreading means is a high heat conductive plate located from one side of and perpendicularly to said bases. In such configuration, said high heat conductive plate thermally connected with said electronic component and said high heat conductive plate located from one side of and perpendicularly to said bases. In such configuration, said heatsinks and said high heat conductive plate can made as a single whole.

In either configuration, said heat exchanging means are upstanding pins and/or fins contacting said base.

DETAILED DESCRIPTION OF PREFERRED EMBODIMENTS

Preferred embodiments of the present invention will be described in detail below with reference to the accompanying drawings. The numbering of components is consistent throughout, with the same components having the same number.

Figure 1:
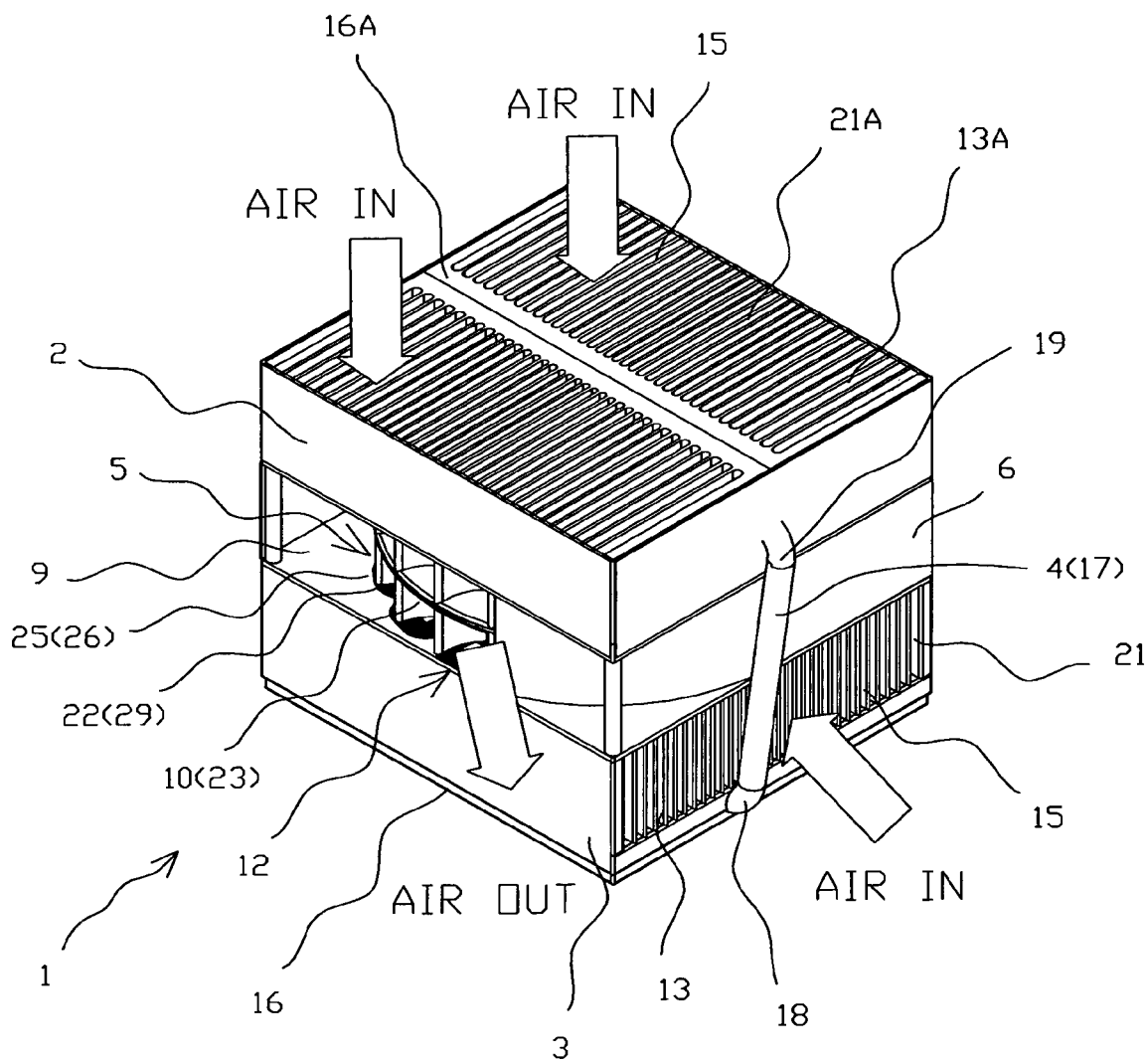
FIG. 1 is a perspective view showing the cooler for cooling of electronic components according to the preferred embodiment of the present invention.
Figure 2:
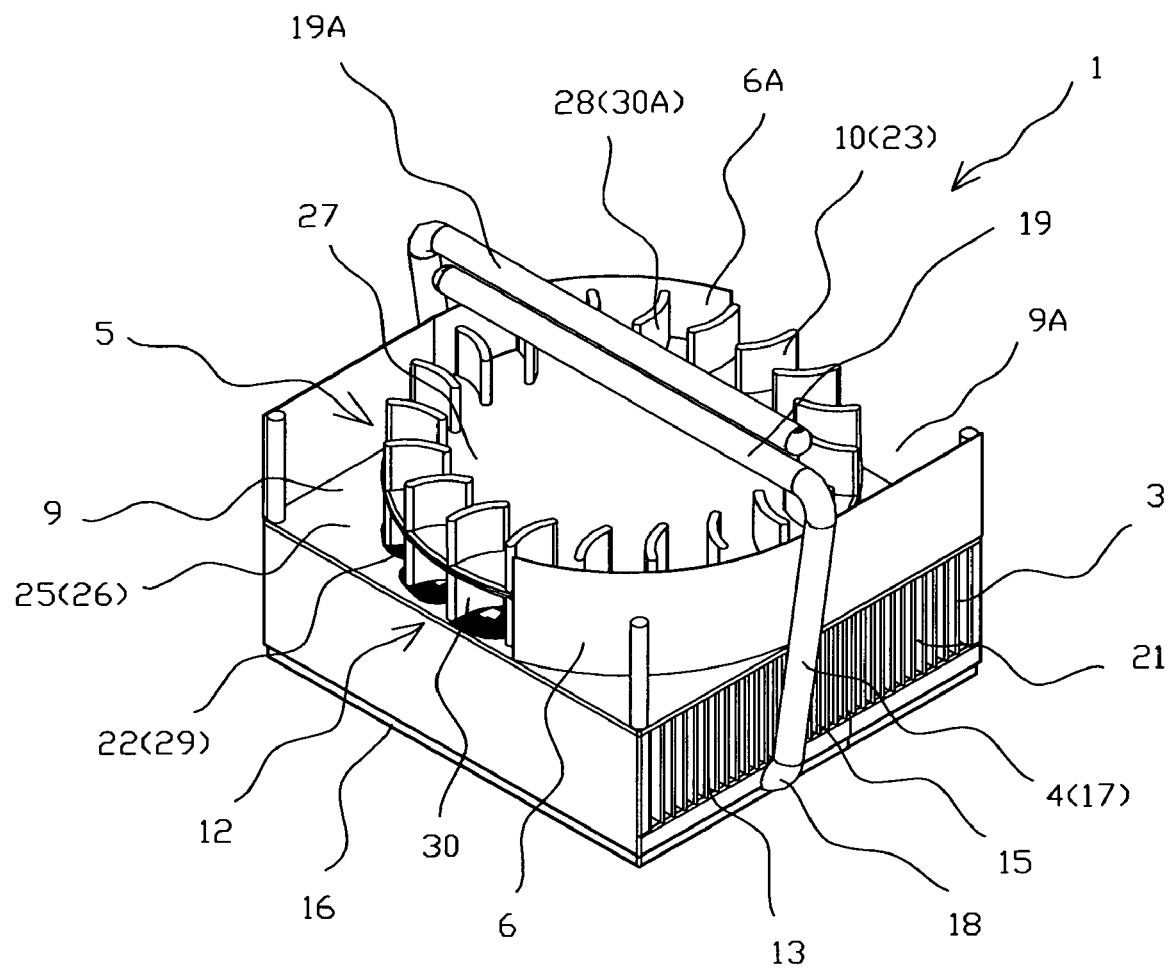
FIG. 2 is a perspective view showing the a cooler for cooling of electronic components according to the preferred embodiment of the present invention without top heatsink.
Figure 3:
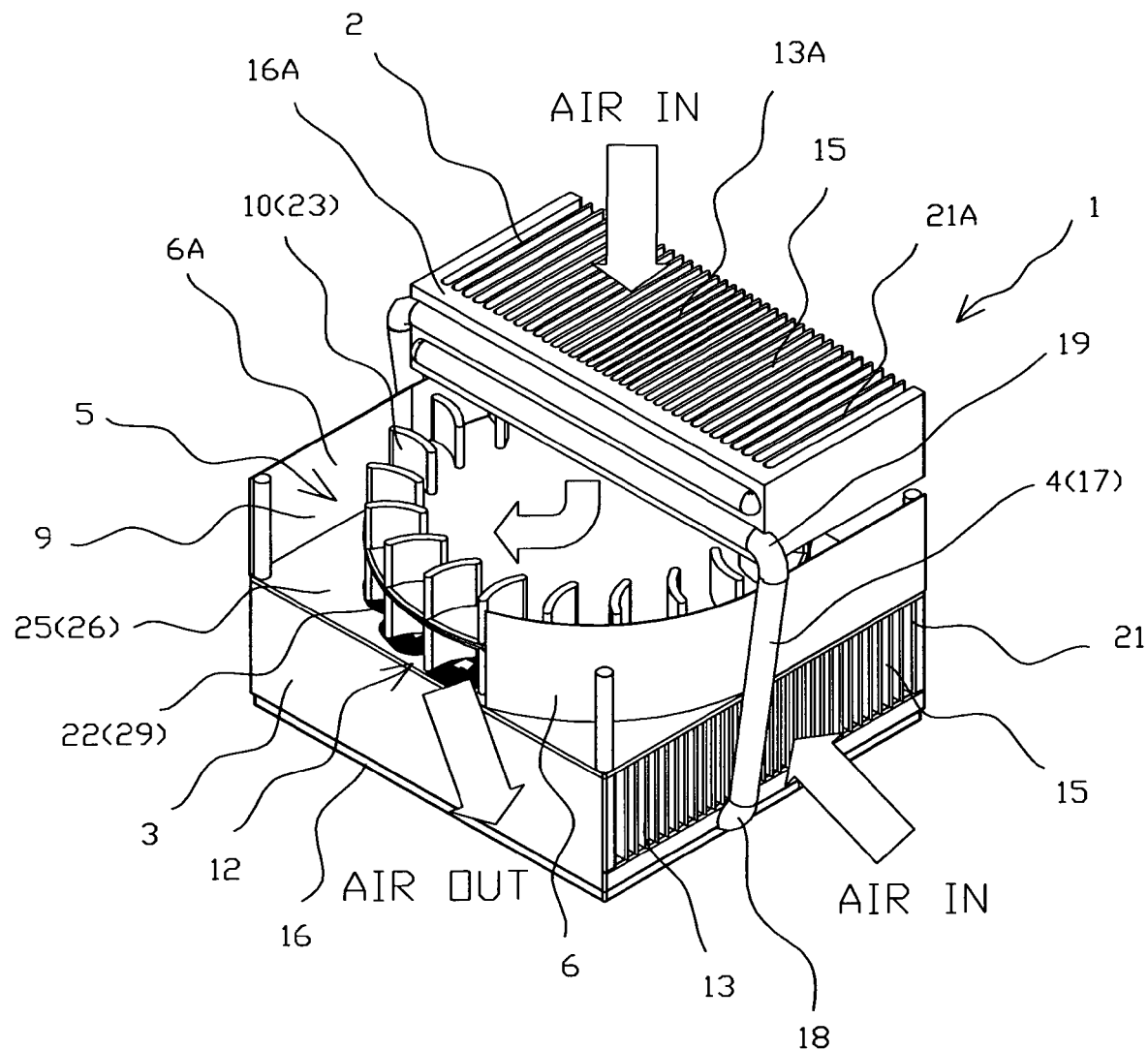
FIG. 3 is a perspective view showing the a cooler for cooling of electronic components according to the preferred embodiment of the present invention with half of the top heatsink cutout exposing the heat spreading means.
Figure 4:
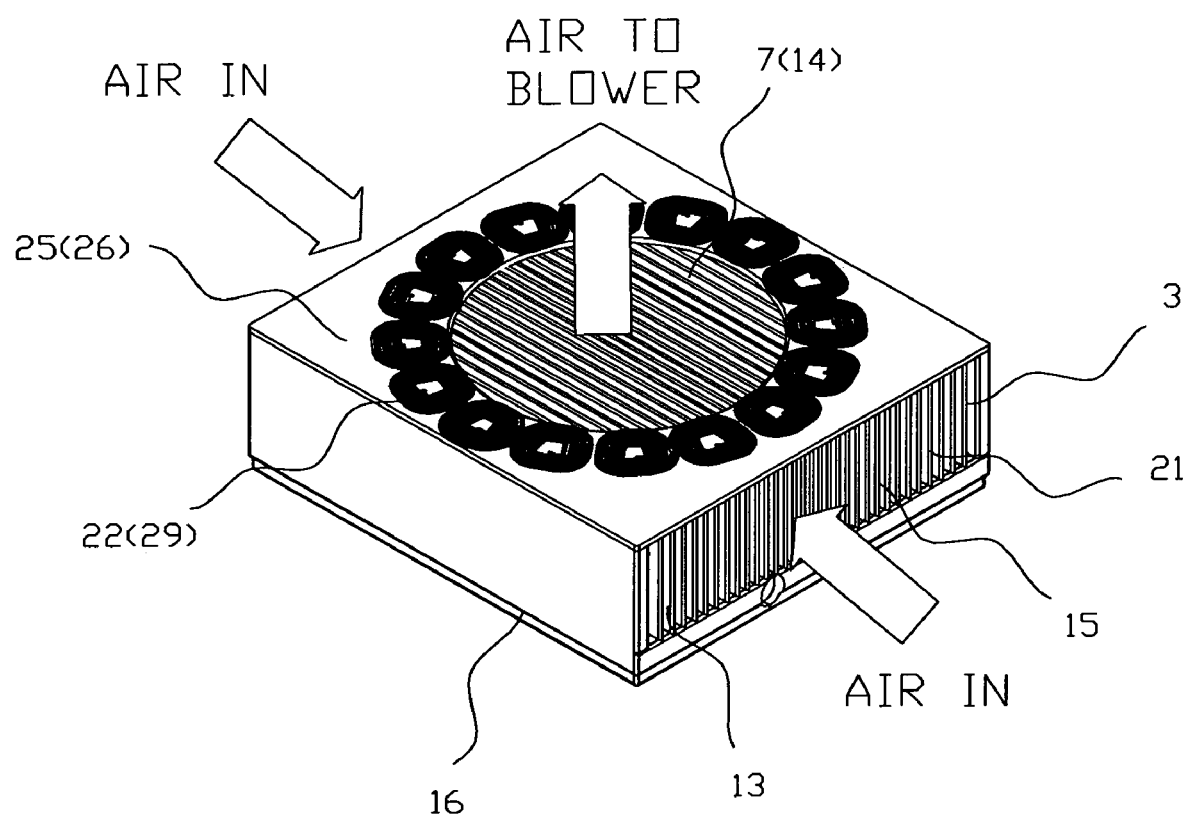
FIG. 4 is a perspective view showing the a cooler for cooling of electronic components according to the preferred embodiment of the present invention without the top heatsink and centrifugal blower.
Figure 5:
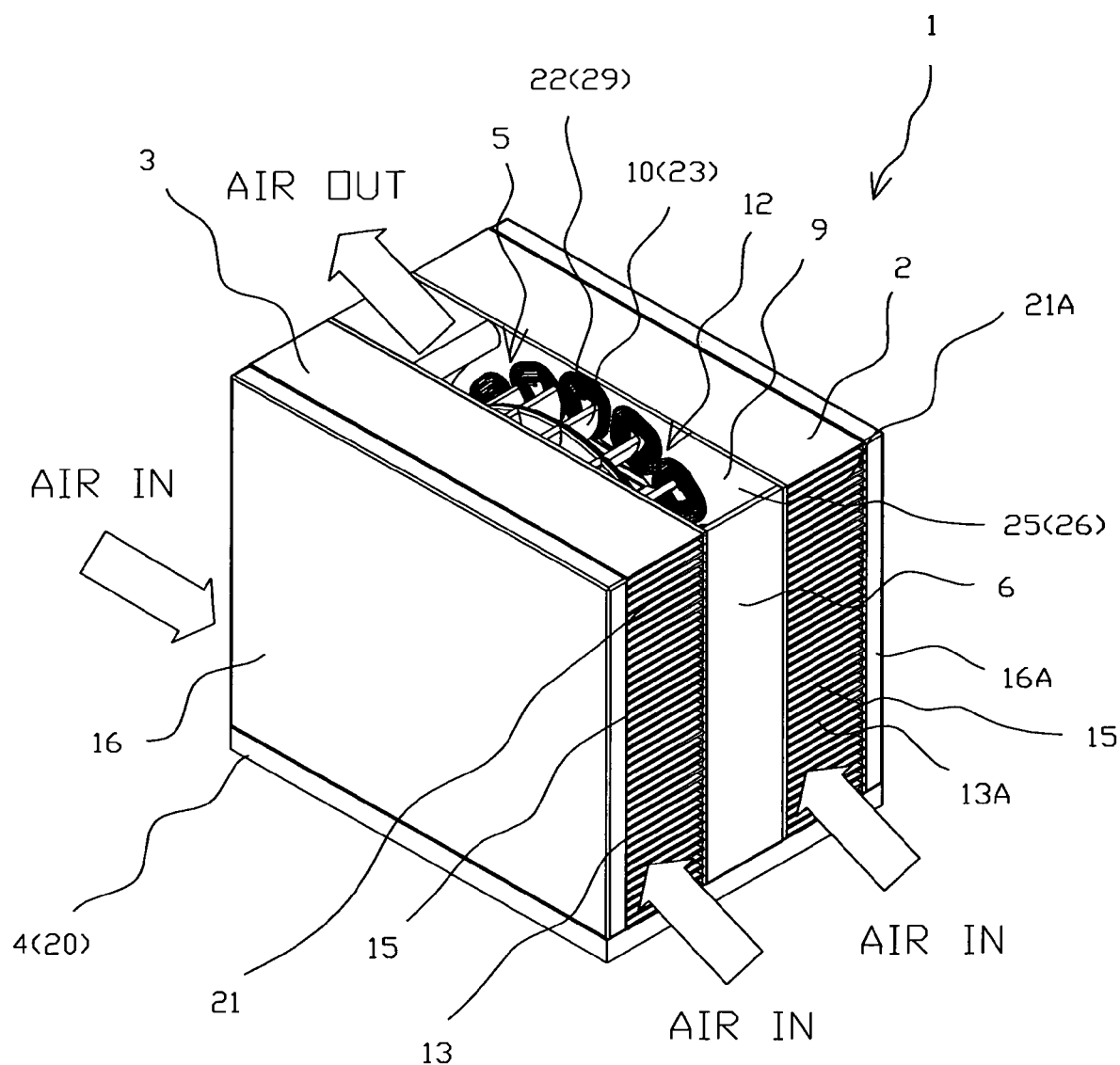
FIG. 5 is a perspective view showing the cooler for cooling of electronic components according to the second embodiment.
Figure 6:
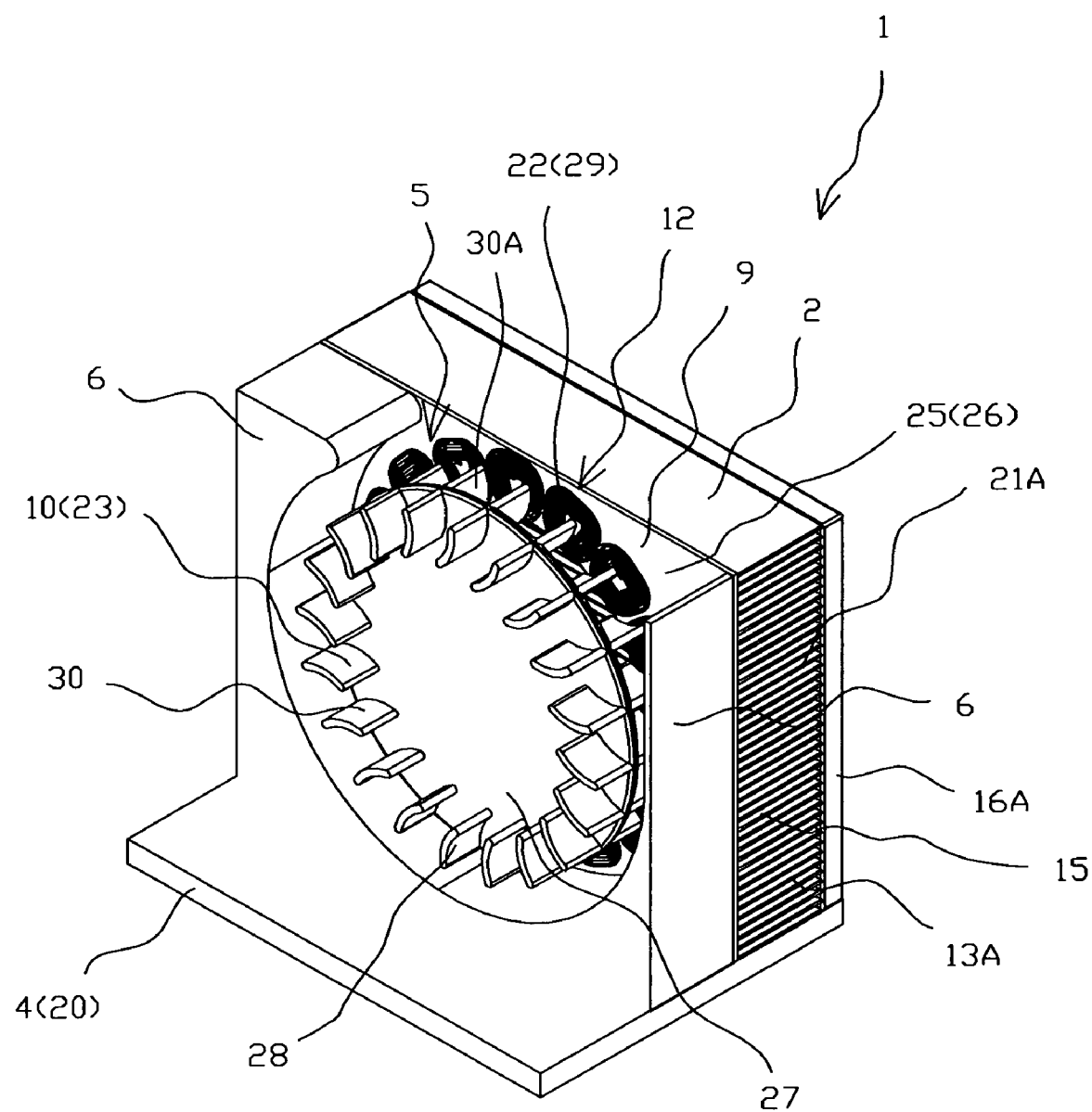
FIG. 6 is a perspective view showing the cooler for cooling of electronic components according to the second embodiment shown in FIG. 5 without one heatsink exposing the centrifugal blower.
Figure 7:
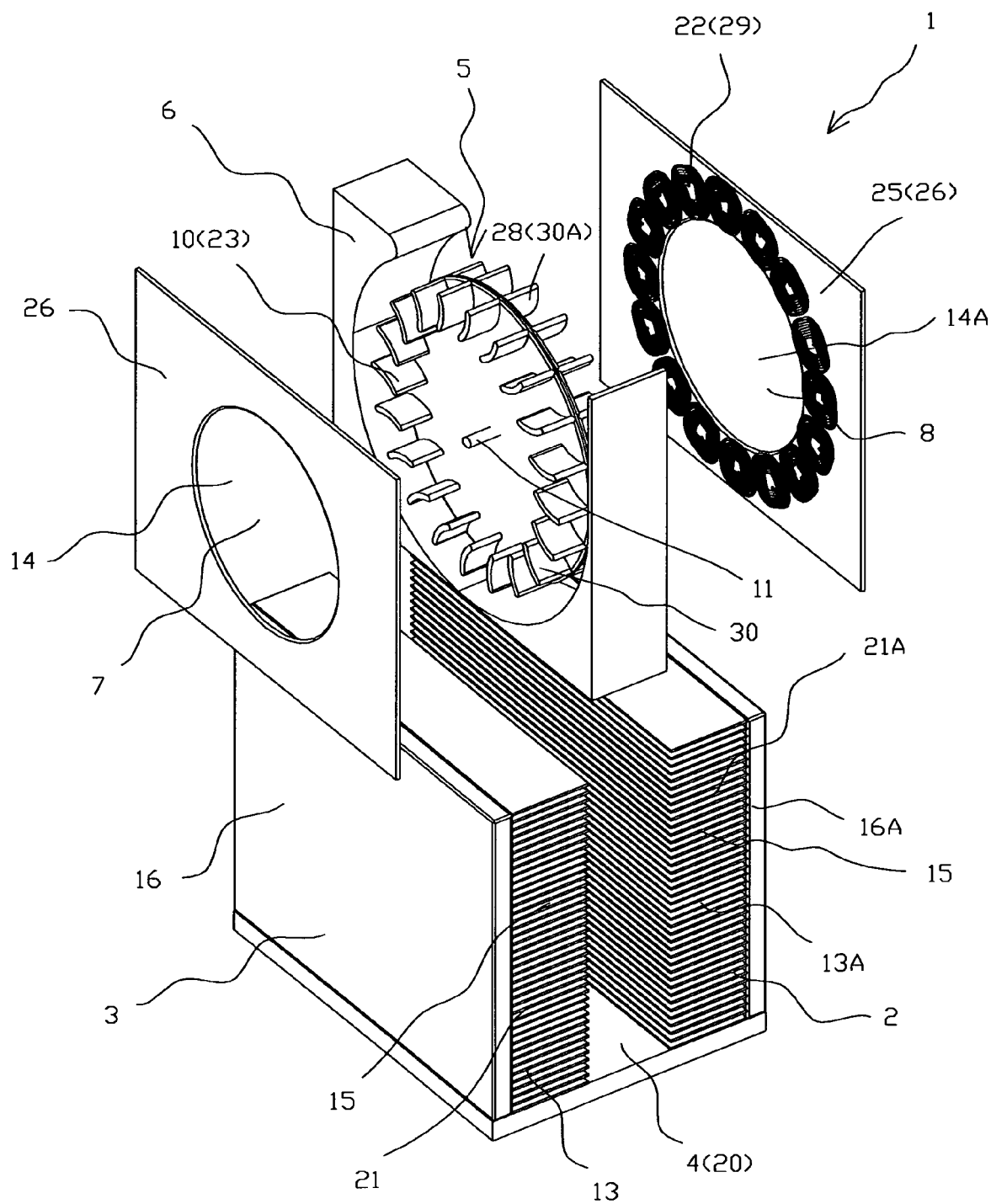
FIG. 7 is an exploded view of the cooler for cooling of electronic components according to the second embodiment of the present invention shown in FIG. 5.

FIGS. 1–7 show the preferred embodiments of the present invention.

The cooler 1 for cooling of electronic components (not shown) comprises of at least two heatsinks 2 and 3 thermally connected with each other by heat spreading means 4, and a double inlet centrifugal blower 5 comprising a casing 6 and 6A with two inlets 7 and 8, and an outlet 9, a radial impeller 10 with an axle 11, and an electric drive 12, wherein each of the heatsinks 2 and 3 comprises inflow openings 13 and 13A, outflow openings 14 and 14A, heat exchanging means 15, and bases 16 and 16A providing thermal contact with the heat exchanging means 15. The impeller 10 comprises two sets of radial blades 30 and 30A located from both sides of an impeller disk 27. The double inlet centrifugal blower 5 located between heatsinks 2 and 3 thus each of the outflow openings 14 and 14A coincide with the closest inlet 7 or 8, so cooling air flows through the inflow openings 13 and 13A, the heat exchanging means 15, the outflow openings 14 and 14A, and inlets 7 and 8 of the blower 5 in a series way.

The base 16 of at least one said heatsink 2 or 3 thermally connected with said electronic components (not shown).

The heat spreading means 4 is at least one heat pipe 17 comprises of evaporator 18 and condenser 19 parts, to facilitate heat transfer, said parts thermally connected with bases 16 and 16A of two different heatsinks 2 and 3.

According to the second embodiment (FIGS. 5–7) the heat spreading means 4 may comprise of a high heat conductive plate 20 located from one side of and perpendicular to the bases 16 and 16A. Furthermore, the high heat conductive plate 20 thermally connected with electronic components (not shown). The heat exchanging means 15 are upstanding pins and/or fins 21 and 21A contacting the bases 16 and 16A.

Both upstanding fins 21 and 21A, the bases 16 and 16A, and high heat conductive plate 20 are made from high heat conductive material. It is preferably to made the upstanding fins 21 and 21A and the bases 16 and 16A as single wholes, correspondingly. In this case it is possible to use well-known extrusion technology.

Further, the heatsinks 2 and 3, and high heat conductive plate 20 can be made as a single whole.

The electric drive 12 is a flat type motor and comprises the stator 22, a magnetized rotor 23 and a controller (not shown on FIGS.) The magnetized rotor 23 is integrated with the impeller 10.

The stator 22 is constructed as printed circuit boards 25 that position on the stator plate 26 and use with the controller.

The controller (not shown on FIGS.) may be a full Bridge Drive or a Two Phase-Single Ended Drive, for example of type Fairchild NDSSS58H.

According to the preferred emdodiment the magnetized rotor 23 is made of the impeller disk 27 rigidly mounted perpendicularly to the axle 11 and comprises an outer circumferential array of radial extending unlike and or like magnetized poles 28 made like blades 30 and/or 30A located from both sides of the impeller 10. The stator 22 comprises of a circumferential array of coils 29 on the circuit boards 25 placed on stator plate 26, each coil 29 is wound about an axis parallel to the axle 11 for generating an axially directed electromagnetic field that interacts with magnetic flux lines of each magnetized pole 28.

The operation and design of the electric drive 12 in the present invention is substantially similar as was described in the U.S. patent application Ser. No. 10/183,032 for BRUSHLESS DC ELECTRIC MOTOR for the same Assignee, which is hereby incorporated by this reference for all that disclosed therein.

The cooler 1 for cooling of electronic components operates in the following way. When electric power is supplied to the stator 22 (its coils 29) of the electric drive 12, alternate electromagnetic fields are created. These electromagnetic fields interact with a magnetic field created by the magnetized poles 28 made like blades 30 and/or 30A of the impeller 10 which serve as the magnetic rotor 23 of the electric drive 12. As a result the impeller 10 is rotated. Because the blower 5 made as the double inlet centrifugal blower, lower pressure areas are created from the both side of the impeller disk 27. Therefore, cooling air at the ambient temperature starts moving and flows through the inflow openings 13 and 13A of the heat-exchanging means 15 of the heatsinks 2 and 3 simultaneously (the arrows AIR IN illustrated air flow direction are shown on FIGS. 1 and 3–5). When cooling air flows through the heat-exchanging means 15 the intensive process of heat exchange takes place. After that, heated cooling air flows from both sides in respect to the impeller disk 27 through the outflow openings 14 and 14A, which coincide with the corresponding inlets 7 and 8 of the blower 5. The casing 6 and outlet 9 of the blower 5 form together an outtake path of air to ambient (the arrows AIR OUT illustrated air flow direction are shown on FIGS. 1 and 3–5).

According to the first embodiment (FIGS. 1–4) heat generated by electronic component transfers to the base 16 of the heatsink 3 due its thermal contact and spread to the base 16A of the heatsink 2 by the heat spreading mean 4 made as the heat pipe 17. According to the second embodiment (FIGS. 5–7) heat generated by electronic component transfers to the high heat conductive plate 20 due its thermal contact and then spread to the bases 16 and 16A of the heatsinks 3 and 2 correspondingly. For both embodiments heat from the bases 16 and 16A due to the thermal connection transferred to the heat exchanging means 15 of both heatsinks 2 and 3.

What is claimed is:

1. A cooler for cooling of electronic components comprising at least two heatsinks thermally connected with each other by heat spreading means, and a double inlet centrifugal blower comprising a casing with two inlets and an outlet, a radial impeller with an axle and a flat electric drive, wherein
   (i) each of said heatsinks comprising inflow and outflow openings, and thermally connected heat exchanging means and a base;
   (ii) said impeller comprising radial blades located from both sides of an impeller disk;
   (iii) said flat electric drive comprising a stator made as a printed circuit board positioned on a stator plate, and a magnetized rotor integrated with said impeller;
   (iv) said stator plate being made as a part of said casing with said inlet;
   (v) said double inlet centrifugal blower being located between said heatsinks thus each of said outflow openings is coincided with said closest inlet, so cooling air flows through said inflow openings, said heat exchanging means, said outflow openings and said inlets of said blower in a series way.

2. The cooler as in claim 1, wherein said heat spreading means are made as at least one heat pipe comprising evaporator and condenser parts that are thermally connected with said bases of said two different heatsinks.

3. The cooler as in claim 1, wherein said heat spreading means are made as a high heat conductive plate located at one side of and perpendicular to said bases.

4. The cooler as in claim 3, wherein said heatsinks and said high heat conductive plate are made as a single whole.

5. The cooler as in claim 1, wherein said heat exchanging means are upstanding pins and/or fins contacting said base.

6. The cooler as in claim 1, wherein said radial blades comprises extending unlike and or like magnetized poles.

* * * * *